United States Patent [19]

Ong

[11] Patent Number: 5,766,535
[45] Date of Patent: Jun. 16, 1998

US005766535A

[54] PRESSURE-PLATE-OPERATIVE SYSTEM FOR ONE-SIDE INJECTION MOLDING OF SUBSTRATE-MOUNTED INTEGRATED CIRCUITS

[75] Inventor: E. C. Ong, Cupertono, Calif.

[73] Assignee: Integrated Packaging Assembly Corporation, San Jose, Calif.

[21] Appl. No.: 868,748

[22] Filed: Jun. 4, 1997

[51] Int. Cl.$^6$ ................................ B29C 45/14
[52] U.S. Cl. .................... 264/272.15; 264/272.17; 264/275; 264/279; 425/116; 425/117
[58] Field of Search ................. 264/272.17, 275, 264/279, 272.15; 425/116, 117, 121, 125, 544, 572, 577, DIG. 228; 249/95, 91

[56] References Cited

U.S. PATENT DOCUMENTS

| | | | |
|---|---|---|---|
| 4,368,168 | 1/1983 | Slepcevic | 264/272.17 |
| 4,954,308 | 9/1990 | Yabe et al. | 264/272.17 |
| 4,980,016 | 12/1990 | Tada et al. | 264/272.17 |
| 5,118,271 | 6/1992 | Baird et al. | 425/116 |
| 5,365,655 | 11/1994 | Rose | 264/272.17 |
| 5,405,255 | 4/1995 | Neu | 425/546 |
| 5,609,889 | 3/1997 | Weber | 425/116 |

FOREIGN PATENT DOCUMENTS 60-242017  12/1985  Japan ................. 264/272.17

*Primary Examiner*—Khanh P. Nguyen
*Attorney, Agent, or Firm*—Donald R. Boys

[57] ABSTRACT

A mold system for encapsulating substrate-mounted ICs includes a split mold having a lower cavity adapted for positioning the substrate and an upper cavity adapted for providing a volume space around the IC. The lower cavity is provided with a compressible shim plate adapted to lie on a bottom surface of the lower cavity such that a substrate of a substrate-mounted IC placed in the lower cavity will extend above the upper limit of the lower cavity, which is the split surface of the mold. As the split mold is closed, a lower surface of the upper mold portion encounters first an upper surface of the substrate, then the compressible shim plate is compressed until the mold is fully closed, at which time the lower surface of the upper mold portion is in intimate contact with both the substrate and the upper surface of the lower mold portion. The IC mounted on the substrate is then presented in the upper cavity for encapsulation. This apparatus and method allows a lower mold portion having a single cavity depth to be used to encapsulate substrate-mounted ICs wherein the substrate thickness may vary from part-to-part.

7 Claims, 3 Drawing Sheets

PRESSURE-PLATE-OPERATIVE SYSTEM FOR ONE-SIDE INJECTION MOLDING OF SUBSTRATE-MOUNTED INTEGRATED CIRCUITS

FIELD OF THE INVENTION

The present invention is in the field of integrated circuit (IC) encapsulation and has particular application to one-side molding of ICs mounted on substrates, such as for Ball Grid Arrays (BGAs).

BACKGROUND OF THE INVENTION

Before integrated circuits (ICs), sometimes termed chips or dies in the art, are attached to a printed circuit board, they are packaged by encapsulation in a polymer material. The encapsulation process is designed to protect the individual IC during handling and operation. Typically, the process used involves a suitable polymer that is injected in a liquid-phase into a mold cavity that contains the IC to be encapsulated. During the injection process, the mold is held closed by substantial pressure. As this process is part of a manufacturing operation, many ICs of a common type are typically processed at the same time, using the same molding fixture. After the encapsulation process is completed and the polymer has solidified, the mold is separated. Finished parts are then collected for further processing that may be needed before they can be mounted to a printed circuit board (PCB).

There are many different types of integrated circuits. There are variations in shape, size, and configuration. Therefore, there are differences in techniques for encapsulation. Some ICs are encapsulated using a process called Lead Frame Injection designed to facilitate Surface Mount Technology (SMT) which is a method for attaching an IC package to a PCB. There are some types of packages wherein an IC is mounted to one side of a substrate, and encapsulation is performed to protect the IC on the side of the substrate to which the IC is mounted. These and other molding processes are well known in the art and are typically automated processes geared for mass production.

For the purpose of this specification, injection molding of the type used in IC encapsulation for one-sided-molded packages, such as for BGA packages, will be solely addressed hereafter, as this is the type of process that is relevant to the present invention.

In the process of making a BGA and some other types of packages incorporating one-side molding, an IC is typically attatched to the top surface of a substrate material by means of a suitable adhesive that can withstand process temperatures. The ICs are typically rectangular in shape with an area footprint that is somewhat smaller than the area of the substrate to which they are mounted. While it is not specifically required, the respective geometric shapes of the IC and the substrate are generally the same.

Substrates used in forming one-side-molded IC packages typically vary in thickness depending, in part, upon the specific application for which The ICs are designed. In a typical one-side molding operation, the thickness of a substrate plays a critical role in the success of the process. This is because, in a typical operation, one of the mold plates has to match the substrate thickness, as will be apparent in further description below.

Molds of the type used in one-side molding encapsulation typically comprise four separate plates that are adapted to be held in alignment with respect to one another. Generally, there is a base plate, a package locator plate, a cavity plate, and a top plate. It is the package locator plate that is typically sized in thickness to the thickness of the substrate upon which an IC is mounted. These mold plates may be fabricated from heat-treated tool steel, enabling the mold assembly to withstand substantial temperature and pressure, and to resist wear and damage.

In conventional applications of IC encapsulation, the substrate rests flat on a base plate. A package locator plate has a matrix of openings adapted to receive and position substrates. The locator plate is of a thickness to allow a cavity plate with smaller openings to sit flush against the substrates and the top surface of the locator plate at the same time, making contact with both surfaces in the same plane. The IC, which is mounted to the substrate, is thus positioned within an opening in the cavity plate. A top plate sits flush on the cavity plate, which is thicker than the substrate, completing a cavity enclosure. Liquid phase polymer injected into the cavities thus formed encapsulates the ICs mounted to the substrates.

As described above, thickness of the substrate to which the IC is mounted to is critical. In a mold set provided for molding packages wherein substrate thickness varies, several alternate locator plates must be maintained to be substituted in the mold set to accommodate change in substrate thickness.

What is clearly needed is a method and apparatus wherein one locator plate of a single thickness may be used in one-side package molding wherein the substrate thickness may vary, thereby eliminating the need for batch-specific locator plates, time consuming inspection processes, and also reducing periodic mold plate modification requirements.

SUMMARY OF THE INVENTION

In a preferred embodiment of the present invention a method is provided for one-side encapsulation of substrate-mounted integrated circuits (ICs) in a split mold including a lower mold portion having a first cavity with a bottom surface and a first depth for containing and positioning the substrate, and an upper mold portion having a second cavity of a second depth for surrounding the IC to be encapsulated with a volume space for injecting molding material, wherein the mold is split along a plane at the upper extremity of the lower cavity, there being an upper plane surface of the lower mold portion and a lower plane surface of the upper mold portion. The method comprises steps of (a) placing the substrate-mounted IC and a compressible pressure plate in the first cavity such that the compressible pressure plate spaces the substrate from the bottom surface of the first cavity, a portion of the substrate is held within the lower cavity portion, and an upper surface of the substrate extends above the upper plane surface of the lower mold portion; (b) closing the split mold such that the lower plane surface of the upper mold portion first contacts the upper surface of the substrate, then compresses the compressible pressure plate until the lower plane surface of the upper mold portion contacts the upper plane surface of the lower mold portion, placing the substrate wholly within the lower cavity with the upper surface of the substrate, the lower surface of the upper mold portion, and the upper surface of the lower mold portion coplanar, and placing the IC wholly within the second cavity; and (c) injecting molding material into the second cavity. In some embodiments the mold comprises more than two portions, such as separate planar plates. In some embodiments as well a non-compressible shim plate is placed between the compressible pressure plate and the substrate to aid in evening pressure and avoiding distortion. The non-compressible shim plate can be a metal plate. Preferably there are in a single split mold multiple cavities for batch molding a plurality of substrate-mounted ICs simultaneously.

The system and method of the invention in various embodiments provides a means of using a mold having a single cavity depth for substrates of varying depth from part-to-part.

BRIEF DESCRIPTION OF THE DRAWING FIGURES

DESCRIPTION OF THE PREFERRED EMBODIMENTS

Figure 1:
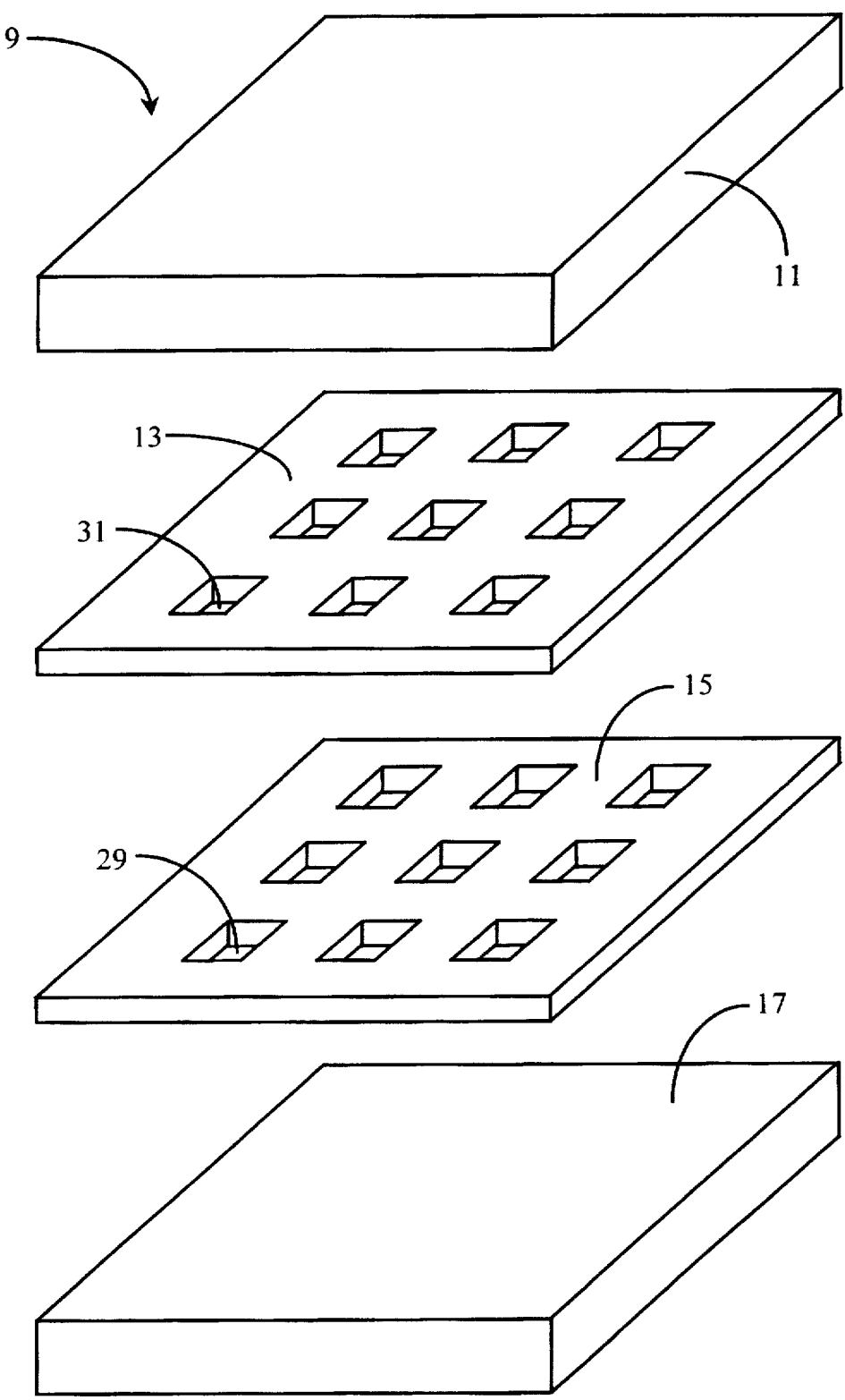
FIG. 1 is an isometric exploded view of a typical injection mold used in one-side molding.

FIG. 1 is an isometric exploded view of a typical four-plate injection mold 9 as is known in current art. There are four mold plates comprising mold 9 shown separated from each other in this example for illustrative purposes. A base plate 17 serves as the base of the mold, and supports a package locator plate 15. Package locator plate 15 has a matrix of openings 29 that are provided both geometrically and asymmetrically to receive and position substrates for IC packages for encapsulation. In this example there are nine openings 29, however many more may be incorporated into mold 9 to facilitate mass production.

In typical plate molds for one-side molding, there are elements provided, such as alignment pins, to facilitate alignment of the plates. These elements are not illustrated here for the sake of simplicity.

When package locator plate 15 is properly aligned and seated flush to base plate 17, pockets are formed into which substrates having mounted ICs may be placed. Mold cavity plate 13 has a matrix of cavity openings 31 spaced according to the geometry of the openings in package locator plate 17. Openings 31 are somewhat larger in all dimensions than the dimensions of a mounted IC, and therefore form cavities with clearance around the sides and top of the ICs. It will be apparent to one with skill in the art that any suitable shape may be used, such as circular, triangular, or hexagonal, etc. Typically, however, the shape of the encapsulation cavity follows the shape of a mounted IC.

When mold cavity plate 13 is properly aligned over and seated flush to package locator plate 15, openings 31 align with openings 29. The IC packages, consisting of an IC mounted to the top surface of a substrate as described above, are placed in openings 29 to rest on the upper surface of mold bottom plate 17. In this position, ideally the upper surface of the substrate is at the same level as the upper surface of the package locator plate. This allows mold cavity plate 13 to sit flush against package locator plate 15 and the top of the substrate as described in the background section. The actual IC is thus presented into openings 31 of mold cavity plate 13, with the top surface of the IC below the top surface of mold cavity plate 13.

Mold top plate 11 is seated flush to mold cavity plate 13 creating enclosed areas for encapsulation of the ICs. Mold 9, thus assembled and containing ICs mounted to substrates for one-side encapsulation, is then subjected to a closing force of a controlled pressure while liquid-phase polymer is injected through injection holes (not shown) in mold 9.

It is clear that substrates inserted into the mold must be of uniform thickness. For example, in a multi-package mold, if one substrate is thicker than the rest the plates of the mold will not close properly, and damage and process failure may well be the outcome. Also, if one substrate is thinner than the others, that substrate will not make proper contact with the mold cavity plate, allowing polymer to escape and create flash.

Due to the near zero tolerance variation requirements for the substrates, package locator plates must be batch specific. For example, if an operator has five separate batches to run, and the substrate thickness is different for each of the five batches, then a different locator plate must be used with each batch. It is conceivable that an entire batch could be lost by simply stacking the wrong locator plate. Rigid inspection processes can help to prevent possible loss of product, however, procedures such as 100% inspection of packages before they go into the mold can be time consuming and costly as is well known in the art.

Materials used in fabrication of mold 9 are critical to operation success as described in the background section. Ideally, mold plates should be flat, parallel in thickness, and contain a smooth finish on molding surfaces. Special machining practices are often used when fabricating mold plates such as surface grinding to obtain flatness or polishing for smooth surfaces. Bores for alignment are also critical, as are dimensions for cut-outs. These requirements add expense to the mold and sometimes contribute to lengthy production set-backs in the event that a mold is cracked, requires modification, or needs a replacement component.

Figure 2:
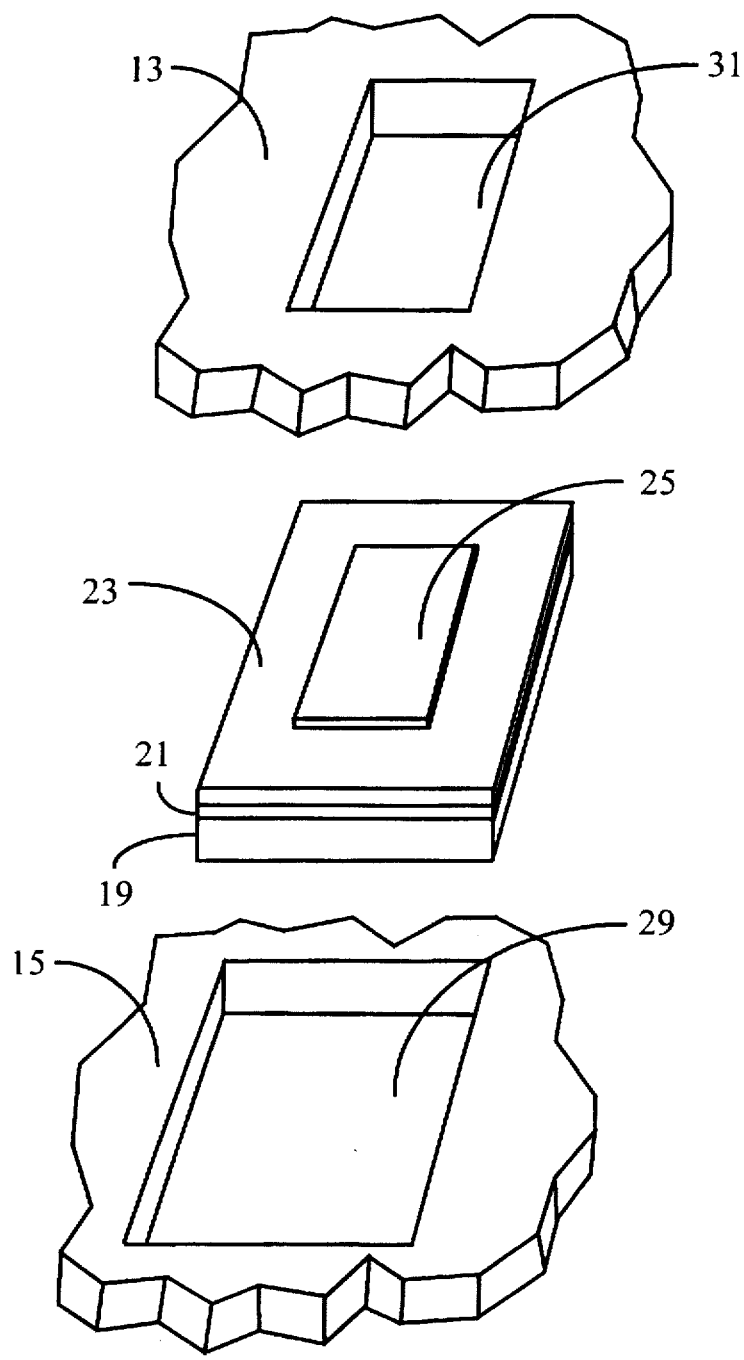
FIG. 2 is an isometric exploded view of a portion of the mold of FIG. 1, including a substrate-mounted IC and pressure plate components, as used in an embodiment of the present invention.

FIG. 2 is an isometric exploded view of a portion of the plates of mold 9 of FIG. 1 illustrating a single opening in the base and cavity plates, and including a substrate-mounted IC package and pressure plate components as are used in an embodiment of the present invention. In this embodiment a compressible pressure plate 19 and a stabilizer shim plate 21 are positioned below substrate 23 upon which an IC 25 is mounted. The stack of pressure plate, shim, and substrate is placed into opening 29 of package locator plate 15, rather than just the substrate-mounted IC.

Pressure plate 19 is made in one embodiment of a compressible material that is able to withstand process temperatures of approximately 150 to 180 degrees Celsius. Silicon rubber, which is available in varying degrees of hardness and thickness is suitable, as well as some other materials.. It will be apparent to one with skill in the art that any suitable material may be used as long as it is compressible and temperature resistant, as described above, without departing from the spirit and scope of the present invention.

In one embodiment, pressure plate 19 may contain relief holes designed to facilitate inward compression. Stabilizer shim 21 is situated above pressure plate 19. Stabilizer shim 21 is designed to provide a largely flat interface to the bottom surface of substrate 23, and also a means whereby pressure exerted on substrate 23 will be equalized, thus reducing stress on substrate 23. Similarly, stabilizer shim 21 tends to equalize the pressure over pressure plate 19 allowing for a more uniform compression (illustrated with more detail in FIG. 3 below).

Stabilizer shim 21 can be fabricated from spring steel or any other suitable material that resists bowing and twisting..

An IC 25 is mounted to substrate 23 in a symmetrical fashion with high-temperature-resistant industrial adhesive. Substrate 23 and IC 25 together form the IC package as previously described.

Figure 3:
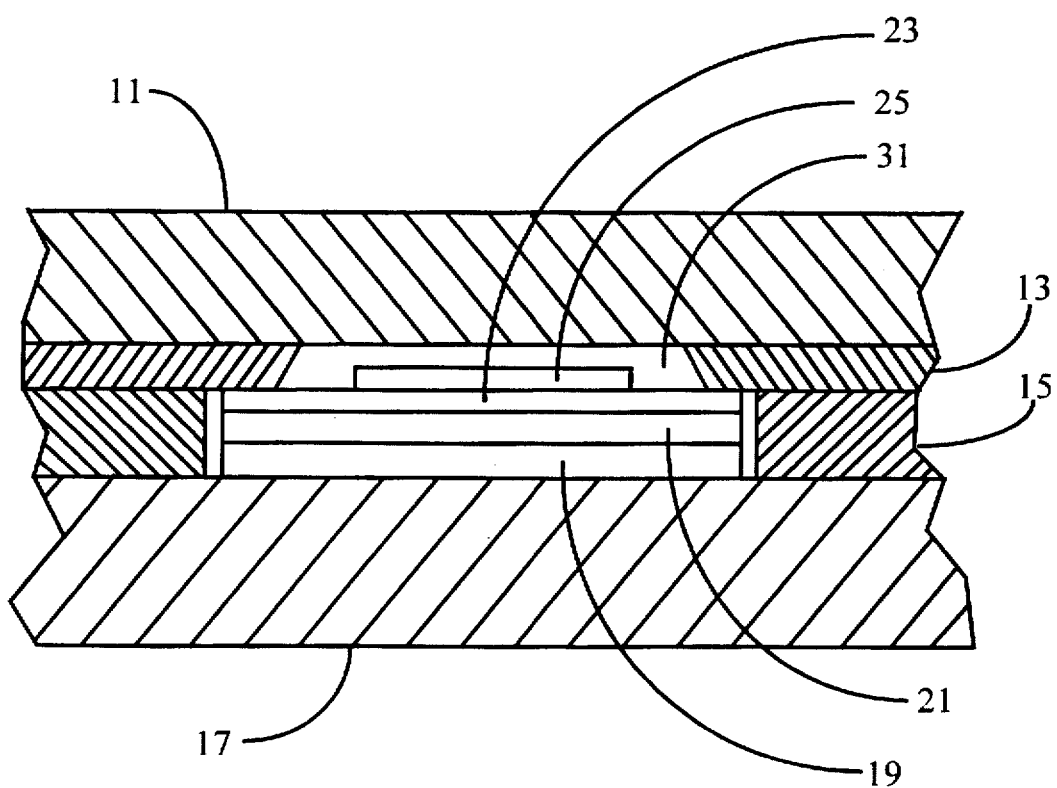
FIG. 3 is an enlarged section view of an exemplary mold cavity shown in a state of compression with IC package and pressure plate components in an embodiment of the present invention.

FIG. 3 is a sectioned elevation view of one mold cavity, as is created in an embodiment of the present invention by compressing base plate 17, package locator plate 15, mold cavity plate 13 and mold top plate 11 together, thereby forming an injection-ready compartment with the IC package and pressure plate components inside. In this compressed state, pressure plate 19 is compressed against base plate 17. Stabilizer shim 21 equalizes the forces over the surfaces of the substrate and the pressure plate, and provides a flat back surface for substrate 23, thereby equalizing the force of mold cavity plate 13 against the top surface of substrate 23, and preventing bowing of the substrate which might otherwise occur. In applications wherein the substrate is sufficiently rigid, the stabilizer shim is not necessary, and is not used.

The total stack height of the pressure plate, substrate, and the stabilizer shim needs to be somewhat greater than the thickness of the package locator plate, so that when the mold is closed, the pressure plate must be compressed to a lesser thickness, allowing the mold cavity plate to contact the substrate and the package locator plate intimately, so molding material may not escape the molding cavity formed around the IC to create flash, which would later have to be trimmed. This compression then allows the bottom surface of mold cavity plate 13 to sit flush against the top surface of substrate 23 and the top surface of package locator plate 15 simultaneously.

The thickness of pressure plate 19 and substrate 23, plus the thickness of the stabilizer shim, all as an operative unit, and with the pressure plate in a decompressed state, must be somewhat greater than the thickness of package locator plate 15 so that packages having substrates of almost any thickness less than the package locator plate may be processed without having to switch package locator plate 15 with another plate of a different thickness. It will be apparent to one with skill in the art that there could be many variations that could be created in using this compressive technique without departing from the spirit and scope of the present invention. For example, varying the thickness' of pressure plate 19 and or stabilizer shim 21. In another embodiment pressure plate 19 could be provided as a single piece with rectangular raises designed to be presented in openings 29 of package locator plate 15 while still utilizing separate stabilizer shims 23. Yet in other molding embodiments, the number of separable mold plates may be greater than four. Given the nature of a rapidly changing and growing technology, other embodiments are possible along with those that have already been stated above.

It will be apparent to those with skill in the art that many alterations may be made in the embodiments described above without departing from the spirit and scope of the present invention. For example, there are many sorts of compressive materials that may be used for pressure plate 19. Similarly different materials may be used for shims, and shims and pressure plates may be provided as pre-molded assemblies. As another example, molds need not be composed of four separate plates as illustrated in various embodiments of the present invention. A base plate and a package locator plate may, for example, be provided as a single structure. The are similarly many other alterations that may be made within the spirit and scope of the invention. The scope of the invention is limited only by the breadth of the claims which follow.

What is claimed is:

1. A method for one-side encapsulation of substrate-mounted integrated circuits (ICs) in a split mold including a lower mold portion having a first cavity with a bottom surface and a first depth for containing and positioning the substrate, and an upper mold portion having a second cavity of a second depth for surrounding the IC to be encapsulated with a volume space for injecting molding material, wherein the mold is split along a plane at the upper extremity of the lower cavity, there being an upper plane surface of the lower mold portion and a lower plane surface of the upper mold portion, the method comprising steps of:

(a) placing an IC mounted on a single substrate that is not a heat sink, a compressible pressure plate, and a shim plate having greater rigidity than the single substrate in the first cavity such that the compressible pressure plate and the shim plate space the substrate from the bottom surface of the first cavity, a portion of the substrate is held within the lower cavity portion, and an upper surface of the substrate extends above the upper plane surface of the lower mold portion;

(b) closing the split mold such that the lower plane surface of the upper mold portion first contacts the upper surface of the single substrate, then compresses the compressible pressure plate until the lower plane surface of the upper mold portion contacts the upper plane surface of the lower mold portion, placing the substrate wholly within the lower cavity with the upper surface of the substrate, the lower surface of the upper mold portion, and the upper surface of the lower mold portion coplanar, and placing the IC wholly within the second cavity; and (c) injecting molding material into the second cavity.

2. The method of claim 1 wherein the mold comprises more than two portions.

3. The method of claim 2 wherein the mold comprises four separate planar plates.

4. The method of claim 1 wherein, in step (a), the compressible pressure plate is spaced apart from the substrate by the shim plate.

5. The method of claim 4 wherein the shim plate is a metal plate.

6. The method of claim 1 wherein the lower mold portion comprises a plurality of first cavities arranged in a matrix pattern and the upper mold portion comprises a plurality of second cavities arranged in the same pattern, such that, with the mold closed each first cavity mates with a second cavity, providing a plurality of positions for encapsulating.

7. The method of claim 1 wherein the compressible pressure plate is made of a silicon rubber material.

* * * * *